(12) United States Patent　(10) Patent No.: US 7,367,817 B1
Liu et al.　(45) Date of Patent: May 6, 2008

(54) HOUSING OF AN ELECTRICAL CARD

(76) Inventors: Chin-Chun Liu, No. 181, Fu Ji, Fu Ji Village, Gongguan Township, Miaoli County (TW); Shih-Tung Liu, No. 181, Fu Ji, Fu Ji Village, Gongguan Township, Miaoli County (TW)

( * ) Notice: Subject to any disclaimer, the term of this patent is extended or adjusted under 35 U.S.C. 154(b) by 0 days.

(21) Appl. No.: 11/558,018

(22) Filed: Nov. 9, 2006

(51) Int. Cl.
*H01R 12/00* (2006.01)
(52) U.S. Cl. .................................................. 439/76.1
(58) Field of Classification Search ............. 439/76.1, 439/737, 630; 361/737, 752, 818; 235/492, 235/441
See application file for complete search history.

(56) References Cited

U.S. PATENT DOCUMENTS

| 5,339,222 | A | * | 8/1994 | Simmons et al. | ............ 361/818 |
| 5,912,806 | A | * | 6/1999 | Onoda et al. | ............... 361/737 |
| 6,166,913 | A | * | 12/2000 | Fun et al. | ..................... 361/737 |
| 6,343,707 | B2 | * | 2/2002 | Cheng | ....................... 220/4.24 |
| 6,381,143 | B1 | * | 4/2002 | Nakamura | ................... 361/737 |
| 6,580,615 | B1 | * | 6/2003 | Nakanishi et al. | .......... 361/737 |
| 6,628,252 | B2 | * | 9/2003 | Hoshino et al. | ............... 345/82 |
| 6,719,570 | B2 | * | 4/2004 | Tsuchioka | ................... 439/76.1 |
| 7,026,546 | B2 | * | 4/2006 | Ge et al. | ..................... 174/520 |
| 7,032,827 | B2 | * | 4/2006 | Wang et al. | ................. 235/492 |
| 7,177,159 | B2 | * | 2/2007 | Wang et al. | ................. 361/797 |
| 2004/0070952 | A1 | * | 4/2004 | Higuchi et al. | ............. 361/737 |

OTHER PUBLICATIONS

Taiwan Patent Appln. No. M256568, Sep. 3, 1993, 24 pages.
Taiwan Patent Appln. No. M283292, Sep. 15, 1994, 15 pages.

* cited by examiner

*Primary Examiner*—Alexander Gilman

(57) ABSTRACT

The invention provides a housing for an electrical card, which is an RSMMC memory card. The housing includes a metal cover and a frame integrally formed at a periphery of the metal cover by way of injection molding. A long frame is formed with a long slot for accommodating a control chip. The long slot has a length ranging from 7 to 9 mm to accommodate various types of control chips. The structure intensity of the long slot can be increased by forming through hole slots to be pressed by push needles at the bottom of the long slot when the frame is injected to cover a metal sheet. Then, the substrate formed with the IC is closed and fixed from the other surface. Thus, it is possible to effectively increase the structure intensity of the long slot to improve the function thereof.

4 Claims, 4 Drawing Sheets

HOUSING OF AN ELECTRICAL CARD

BACKGROUND OF THE INVENTION

1. Field of the Invention

The invention relates to the field of a RSMMC (Reduced Size MultiMedia Card) memory card, and more particularly to an improvement for a housing of a memory card.

2. Description of the Prior Art

Among the current electrical cards, the RSMMC memory card is frequently used in mobile phones and is packaged as follows: a plastic housing is provided to fix the RSMMC memory card to a substrate, wherein the plastic housing is formed by way of injection molding and must keep a predetermined thickness to keep the structure integrity. Thus, under the limitations for the standard thickness of the memory card, the space and height of the plastic housing is inevitably reduced. Thus, the dimension of the control IC is also limited so that the control IC with the larger size and the higher speed cannot be used and only the thinned and miniaturized control IC can be used. However, this thinned and miniaturized control IC has to be formed using a special package processes, so the cost thereof is relatively high, which is disadvantageous to the reduction of the cost of the RSMMC memory card.

Taiwan Patent No. M256568 and Taiwan patent No. M283292 to this inventor disclose memory card packages each including a frame body and a metal sheet combined together to from an upper cover. The portion of the lower cover is formed by directly combining the substrate with the frame body and then forming golden fingers on the other surface of the substrate. Thus, when the memory card is packaged, the accommodating size of the substrate element can be increased, and the mechanical intensity and the distortion-resisting intensity of the housing can be increased.

However, although the above-mentioned two methods are improvements over several prior art problems for the memory card, they neglect the frequently encountered problems of the size of the RSMMC memory card. First, the RSMMC memory card together with the housing have the standard size of 24 mm-18 mm. However, the lateral side is 20 mm after the corner is cut to foom the directionally limited design. Thus, in order to accommodate the integrated circuit device during the package processes, the control IC is placed at the lateral side of the cut corner, and the frame body is directly formed with a slot near the lateral side to accommodate the integrated circuit device (FLASH IC). As shown in Taiwan patent No. M293292, the slot at the long side of the cut corner can directly accommodate the integrated circuit device disposed on the substrate when the substrate is inserted. However, the slot is formed by injecting the plastic material to cover the metal cover. So, the metal sheet in the slot tends to deform due to the weakened metal cover integrity near the slot. Furthermore, the size of the RSMMC chip may vary according to different capacities of the integrated circuit device adapted therein. Also, the metal cover integrity near the slot is too low with current structure design, the slot cannot meet the size of most control chips, and the manufacturing processes are also relatively restricted.

Although other associated references may have different designs and application considerations on the housing of the electrical card, no adaptive design relating to the size of the housing is discussed.

In view of this, it is an important objective subject of the invention to provide a housing for an electrical card satisfying various standard electrical card configurations and having the good metal cover integrity to solve the above-mentioned problems. Thus, the invention provides the novel housing for the electrical card in the following description.

SUMMARY OF THE INVENTION

The invention provides a housing for an electrical card, which is a RSMMC memory card, wherein the RSMMC memory card together with the housing has a standard size of 24-18 mm. Due to the provision of the directionally limiting bevel, the original length thereof is only 20 mm. The structure of the invention includes a metal cover and a frame integrally formed at a periphery of the metal cover by way of injection molding. A long slot for accommodating a control chip is formed with the frame. The long slot has a length ranging from 7 to 9 mm to accommodate various types of control chips. The bottom of the long slot is formed with through hole slots to be pressed by push needles when the frame is injected to cover the metal sheet. Thus, the structural integrity of the long slot can be increased. Then, the other side opposite to the side of the substrate formed with the IC is sealed and fixed to complete the structure of the invention.

The following features can be obtained after comparing the invention structure with the prior art structure.

1. The housing of the electrical card according to the invention utilizes the long slot having the length ranging from 7 to 9 mm to accommodate various types of control chips. In addition, the structure utilizes the metal cover in conjunction with the lower cover formed by the substrate, so the inner space in the housing can be increased, and the flexibility of using various IC devices can be increased.

2. The housing of the invention has the hole slots, which are formed beside the long slot and to be pressed by the push needles, so the structural integrity of the long slot can be effectively increased.

3. The housing of the invention can have the better effect and the higher structural integrity than those of the prior art without modifying the original manufacturing processes. So, the cost effectiveness can be enhanced.

Further aspects, objects, and desirable features of the invention will be better understood from the detailed description and drawings that follow in which various embodiments of the disclosed invention are illustrated by way of examples.

DETAILED DESCRIPTION OF THE PREFERRED EMBODIMENTS

Figure 1:
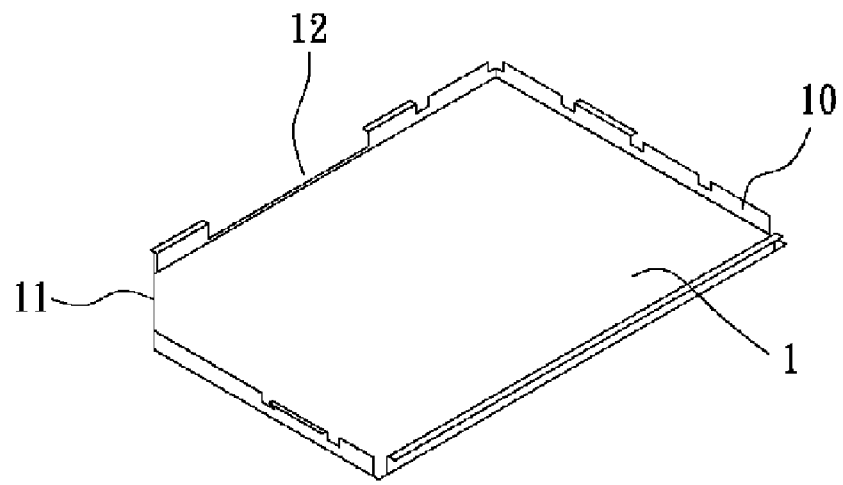
FIG. 1 is a schematic illustration showing an exterior of a metal cover of a housing of an electrical card according to the invention.
Figure 2:
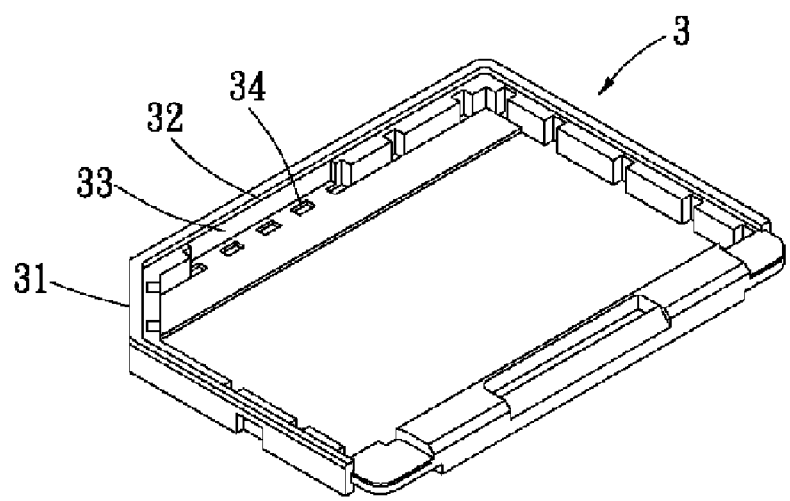
FIG. 2 is a schematic illustration showing the metal cover combined with a frame of the housing of the electrical card according to the invention.
Figure 5:
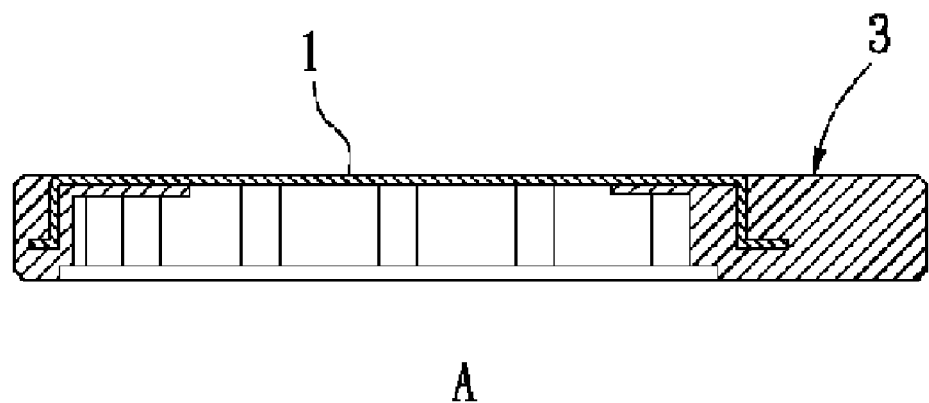
FIG. 5 is a cross-sectional view taken along a line A-A of FIG. 4.

As shown in FIGS. 1, 2 and 5, an improved housing of an electrical card of this embodiment is used in conjunction with a RSMMC memory card and includes a metal cover 1 and a substrate 2. The metal cover 1 has a periphery formed with an L-shaped protruding plate 10 bent downward. A bevel 11 is formed at a corner of the metal cover 1. The metal cover 1 has a long lateral side formed with a notched slot 12 removed from the L-shaped protruding plate 10.

Figure 3:
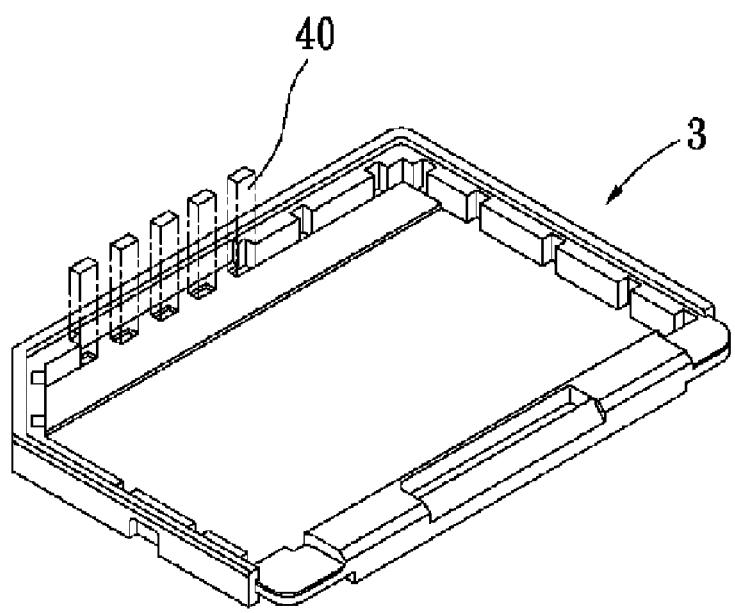
FIG. 3 is a schematic illustration showing push needles of the housing of the electrical card, which press the metal cover according to the invention.

A frame 3 is integrally formed to cover the periphery of the metal cover 1 by way of injection molding. When the frame 3 is formed, a bevel 31 corresponding to the bevel 11 is also formed to provide a directionally limited design to prevent the user from inserting the card incorrectly. The frame 3 is formed with a thinner wall surface 32 corresponding to the notched slot 12 of the metal cover 1 at the long lateral side of the bevel 31. The inner side of the wall surface 32 corresponding to the notched slot 12 of the metal cover 1 is formed with a long slot 33 (see FIG. 2) at the frame 3. The long slot 33 has the length ranging from 7 to 9 mm in order to match with and accommodate control chips with different sizes. Alos, because the provision of the long slot 33 is to match with the notched slot 12, the wall surface 32 is not covered with the L-shaped protruding plate 10 for supporting, and problems with plate deformity may occur during the manufacturing processes. So, in this embodiment, hole slots 34 are formed beside the long slot 33, as shown in FIG. 3. The hole slots 34 can be pressed by push needles 40 during the injection molding process to prevent the metal cover 1 from deforming during the process. That is, the invention has to match with different kinds of control chips, so the long slot 33 must have the length ranging from 7 to 9 mm. In order to prevent the longer long slot 33 from encountering the problem of the insufficient structural integrity, the invention results in better injection quality through application of the push needles 40.

Also, in order to increase the covering integrity of the long slot 33, the lateral side of the long slot 33 is additionally formed with a covering layer for covering the plane of the metal cover 1.

Figure 4:
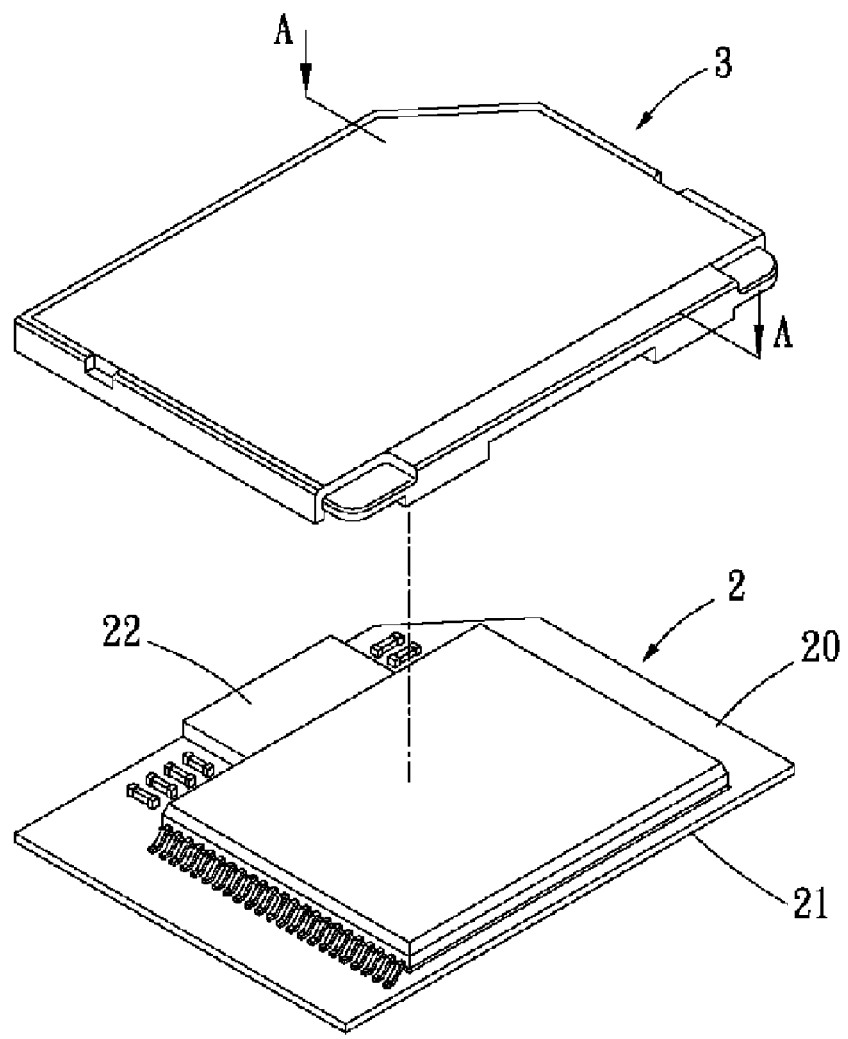
FIG. 4 is an exploded schematic illustration showing the metal cover of the housing of the electrical card, which is to be combined with the substrate according to the invention.

As shown in FIG. 4, the substrate 2 is a circuit board having a circuit layout and includes a first surface 20 and a second surface 21. The first surface 20 is formed with various IC elements for the memory card. The IC elements include a control chip and an integrated circuit device 22. The second surface 21 of the substrate 2 is formed with a plurality of electrical contacts to be electrically connecting to other electrical products.

The first surface 20 of the substrate 2 is placed into the ladder-like support seat formed in the frame 3 and is combined with the support seat.

New characteristics and advantages of the invention covered by this document have been set forth in the foregoing description. It is to be expressly understood, however, that the drawings are for the purpose of illustration only and are not intended as a definition of the limits of the invention. Changes in methods, shapes, structures or devices may be made in details without exceeding the scope of the invention by those who are skilled in the art. The scope of the invention is, of course, defined in the language in which the appended claims are expressed.

What is claimed is:

1. A housing for an electrical card, which is an RSMMC memory card, the housing comprising:

a metal cover having a periphery integrally formed with a frame by way of injection molding, wherein one corner of the frame is formed with a bevel for preventing the card from being inserted incorrectly, a long side of the bevel is 20 mm, a long frame of the bevel is formed with a long slot for accommodating a control chip, a length of the long slot ranges from 7 to 9 mm, a bottom of the long slot is formed with through hole slots for pressing push needles when the frame is injected to cover metal sheets, so as to increase a structure integrity of the long slot; and a substrate comprising a first surface and a second surface, wherein the control chip and a passive device are disposed on the first surface, the first surface is packaged into the metal cover and is positioned with and fixed to the frame of the periphery of the metal cover, and a plurality of electrical contacts is formed on the second surface of the substrate.

2. The housing according to claim 1, wherein the periphery of the metal cover is formed with an L-shaped protruding plate bent downward to increase a combined integrity of the frame and the metal cover.

3. The housing according to claim 2, wherein the metal cover is formed with a notched slot at a position corresponding to the long slot of the long frame of the bevel.

4. The housing according to claim 3, wherein a top surface of the frame is formed with a support seat for supporting the substrate.

* * * * *